United States Patent
Timberlake et al.

(10) Patent No.: US 9,299,534 B2
(45) Date of Patent: Mar. 29, 2016

(54) METHOD AND MECHANISM FOR EROSION DETECTION OF DEFINING APERTURES

(71) Applicant: Varian Semiconductor Equipment Associates, Inc., Gloucester, MA (US)

(72) Inventors: David Timberlake, Lexington, MA (US); Mark R. Amato, South Hamilton, MA (US); Nathan Roth, Peabody, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 115 days.

(21) Appl. No.: 14/169,488

(22) Filed: Jan. 31, 2014

(65) Prior Publication Data
US 2015/0221472 A1  Aug. 6, 2015

(51) Int. Cl.
*G21K 1/00* (2006.01)
*H01J 37/317* (2006.01)
*H01J 37/244* (2006.01)

(52) U.S. Cl.
CPC .......... *H01J 37/3171* (2013.01); *H01J 37/244* (2013.01); *H01J 2237/0213* (2013.01); *H01J 2237/24495* (2013.01); *H01J 2237/24535* (2013.01)

(58) Field of Classification Search
None
See application file for complete search history.

(56) References Cited

U.S. PATENT DOCUMENTS

| | | | | |
|---|---|---|---|---|
| 5,475,231 A * | 12/1995 | Crook | ................... | H01J 37/244 250/397 |
| 5,947,053 A * | 9/1999 | Burnham | ............... | G01N 17/00 116/208 |
| 2008/0073553 A1 | 3/2008 | Blake et al. | | |
| 2011/0031408 A1* | 2/2011 | Riordon | .............. | H01J 37/3171 250/398 |
| 2012/0181443 A1* | 7/2012 | Riordon | .............. | H01J 37/3171 250/395 |
| 2012/0298854 A1* | 11/2012 | Hamby | ................. | H01J 37/023 250/282 |

OTHER PUBLICATIONS

International Search Report mailed Apr. 29, 2015 for International Application PCT/US2015/011115 filed Jan. 13, 2015.

* cited by examiner

*Primary Examiner* — Andrew Smyth

(57) ABSTRACT

A defining aperture plate having at least two differently sized apertures is used in conjunction with at least two charge collectors. Because of the difference in aperture width, the two charge collectors receive different amounts of ions, where the amount is proportional to the associated aperture width. By monitoring the ratio of the charge collected by the first charge collector to the charge collected by the second collector, the amount of erosion can be monitored and optionally compensated for.

17 Claims, 6 Drawing Sheets

# METHOD AND MECHANISM FOR EROSION DETECTION OF DEFINING APERTURES

FIELD

Embodiments of the present disclosure relate to methods and apparatus for detecting erosion of defining apertures, such as those used to measure ion beam current in a beamline ion implantation system.

BACKGROUND

Semiconductor workpieces are often implanted with dopant species to create a desired conductivity. The amount of dopant introduced into the workpiece is critical to its proper operation. Therefore, various techniques have been used to attempt to accurately measure the ion beam current supplied by an ion implantation system. In some embodiments, a charge collector, such as a Faraday cup, is positioned near the workpiece. In this way, the ion beam current can be measured based on the amount of charge collected by the Faraday cup over a given time period. A charge collector which is positioned relative to the workpiece may only receive charge from a portion of the ion beam. In other words, due to its fixed position, the charge collected may not representative of the entire ion beam.

In other embodiments, a charge collector may be mobile so as to be moved through the ion beam. In this case, a plate having an aperture may be disposed between the source of the ion beam and the charge collector, so as to limit the portion of the ion beam that is visible to the charge collector. As the plate and the charge collector are moved across the ion beam, the total charge can be integrated to calculate the beam current. This calculation is based on the speed at which the charge collector is moved and the size of the aperture. While this is a generally effective method to measure ion beam current, it may be susceptible to measurement error. For example, over time, the ion beam tends to erode the plate, particularly around the aperture, so as to increase its size. This increase in aperture size allows more ions to pass through to the charge collector. This results in the system calculating an ion beam current that is greater than the actual current. One method to address this issue is to replace the plate at a predetermined time interval before the effects of erosion become significant. However, this requires that the ion implantation system be taken off-line, thereby reducing efficiency and throughput.

Therefore, a system and method for detecting, and optionally correcting for, erosion of the aperture caused by the ion beam would be advantageous.

SUMMARY

A defining aperture plate having at least two differently sized apertures is used in conjunction with at least two charge collectors. Because of the difference in aperture width, the two charge collectors receive different amounts of ions, where the amount is proportional to the associated aperture width. By monitoring the ratio of the charge collected by the first charge collector to the charge collected by the second collector, the amount of erosion can be monitored and optionally compensated for.

In one embodiment, an ion implantation system is disclosed. The ion implantation system comprises an ion source generating an ion beam; a defining aperture plate having two differently sized apertures; two charge collectors, each disposed behind a respective one of the differently sized apertures; an actuator to drive the defining aperture plate through a portion of the ion beam; and a control system in communication with the two charge collectors to monitor an ion beam current of the ion beam. In a further embodiment, the control system sets parameters for the ion implantation system based on ion beam current. In another further embodiment, the control system calculates an initial aperture ratio, based on a ratio of widths of the two apertures; calculates an updated aperture ratio based on charge measured by the charge collectors; determines a compensation factor based on the updated aperture ratio and the initial aperture ratio; and calculates the ion beam current based on charge collected by the two charge collectors and the compensation factor.

In a second embodiment, a method of processing workpieces using an ion beam is disclosed. The method comprises implanting workpieces using the ion beam, where parameters of the ion implant are based on ion beam current; passing a plate in front of a portion of the ion beam, the plate having two differently sized apertures through which ions may pass; determining an initial aperture ratio, based on a ratio of initial widths of the two apertures; collecting charge received by a first charge collector and a second charge collector, each behind a respective aperture, the charge collected representative of ion beam current passing through the respective apertures; and determining an updated aperture ratio based on a ratio of charge collected by the first charge collector to charge collected by the second charge collector. In a further embodiment, the method further comprises continuing the implanting if the updated aperture ratio does not deviate from the initial aperture ratio by more than a predetermined amount. In another further embodiment, the method comprises ceasing the implanting if the updated aperture ratio deviates from the initial aperture ratio by more than a predetermined amount. In yet another further embodiment, the method comprises determining a compensation factor based on a deviation between the initial aperture ratio and the updated aperture ratio; using the compensation factor to correct for erosion of the apertures in order to calculate ion beam current; and adjusting the parameters used during the implanting based on the calculated ion beam current.

In a third embodiment, a method of processing workpieces using an ion beam is disclosed. The method comprises implanting workpieces using the ion beam, where parameters of the ion implant are based on ion beam current; passing a plate in front of a portion of the ion beam, the plate having two differently sized apertures through which ions may pass; determining an initial aperture ratio, defined as a ratio of a width of a first of the two differently sized apertures to a width of a second of the differently sized apertures; collecting charge received by a first charge collector and a second charge collector, each disposed behind a respective aperture; calculating an updated aperture ratio based on a ratio of charge collected by the first charge collector to charge collected by the second charge collector; determining erosion of the two differently sized apertures based on a comparison of the updated aperture ratio to the initial aperture ratio; and modifying the ion implanting based on the determined erosion. In one further embodiment, the modification comprises ceasing the ion implanting if the determined erosion is greater than a predetermined threshold. In another further embodiment, the modification comprises calculating the ion beam current based on the determined erosion, the charge collected by the first charge collector and the charge collected by the second charge collector; and adjusting the parameters used during the implanting based on the calculated ion beam current.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
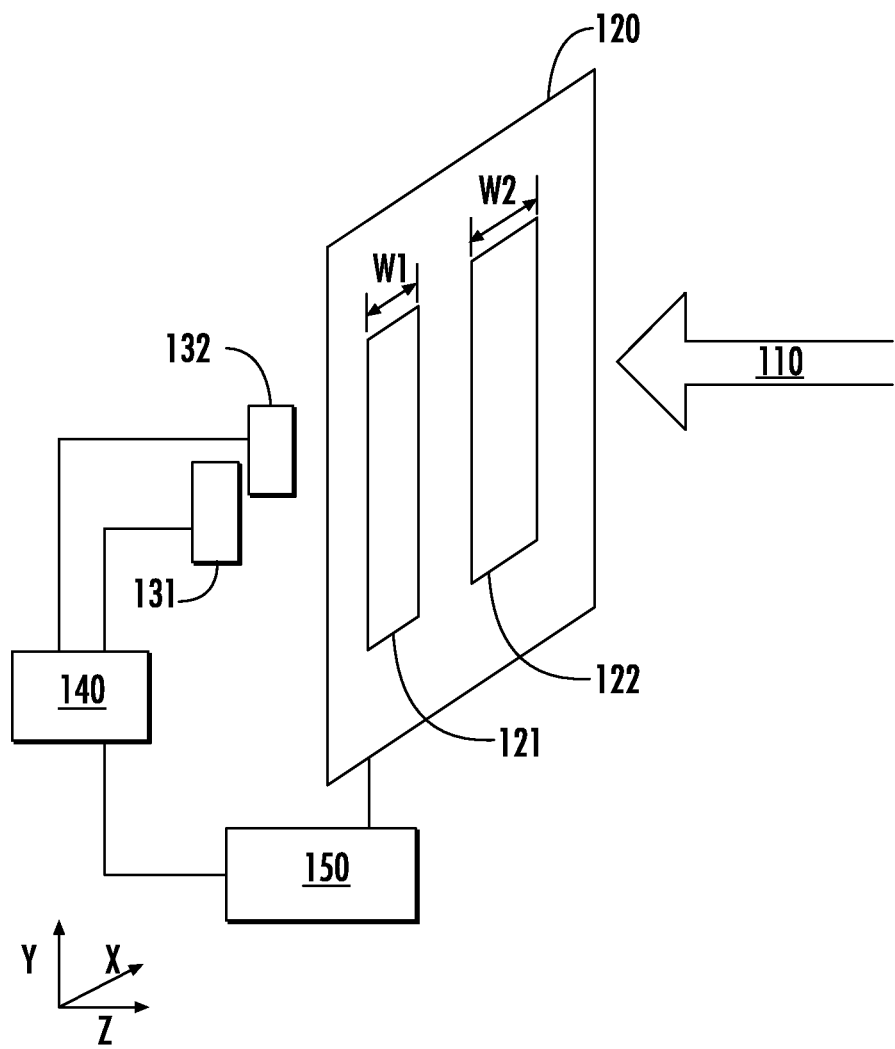
FIG. 1 shows a plate with apertures, according to one embodiment.

As described above, a plate with an aperture, also known as a defining aperture plate, is used to limit the amount of ions that ultimately reach the charge collector disposed between the defining aperture plate. FIG. 1 shows a part of an ion implantation system. Although not shown, the ion implantation system also comprises an ion source, which is used to generate ions. The ion source may be an indirectly heated cathode (IHC) source, a Bernas style source, an RF plasma ion source, or any other known ion source. The ions are then extracted from the ion source and, using a set of beam optics (not shown), are transformed into an ion beam 110. In some embodiments, the resulting ion beam is a ribbon beam, which is an ion beam having a width that is much greater than its height. In other embodiments, a spot beam, which may be a roughly circular beam, may be generated.

This ion beam 110 is directed toward a workpiece (not shown). Typically, the workpiece and the ion beam 110 are moved relative to each other so that all portions of the workpiece are exposed to the ion beam 110. In the case of a ribbon beam, the ion beam 110 may be wider (in the x dimension) than the workpiece, but narrower (in the y dimension) than the workpiece. In this case, the workpiece may be moved in the y, or vertical, direction relative to the ion beam 110, so that all portions of the workpiece is exposed to the ion beam. Of course, in other embodiments, the workpiece may remain stationary, while the ion beam 110 moves in the vertical direction. In other embodiments, both the workpiece and the ion beam 110 may move relative to each other in the vertical direction.

To measure the current of this ion beam 110, a defining aperture plate 120 may be moved in the path of the ion beam 110, between the ion source and the workpiece. The defining aperture plate 120 may be moved horizontally (in the x direction) so as to pass through the entirety of the width of the ion beam 110. In this way, any spatial non-uniformities in the ion beam 110 are observed by the defining aperture plate 120.

The defining aperture plate 120 comprises at least two apertures 121, 122 and a corresponding number of charge collectors 131, 132. These charge collectors may be Faraday cups in one embodiment, although other charge collectors may be used. In this embodiment, a first charge collector 131 is disposed so as to receive ions that pass through first aperture 121. A second charge collector 132 is disposed so as to receive ions that pass through the second aperture 122. As mentioned above, a larger number of apertures, each with a corresponding charge collector may be utilized.

In addition, although the term "defining aperture plate" is used throughout this disclosure, it is understood that this apparatus may also be created using two separate plates, each with a respective aperture. In this embodiment, these two plates may move independently of one another or may have a fixed spatial relationship. Thus, the term "defining aperture plate" should be construed to include embodiments where more than one physical plate are utilized.

In one embodiment, the first charge collector 131 is disposed so as to receive only the ions that pass through the first aperture 121, while the second charge collector 132 is disposed so as to receive only the ions that pass through the second aperture 122.

Additionally, the width of the first aperture 121 (w1) differs from that of the second aperture 122 (w2). The heights of the two apertures 121, 122 may be the same. The first charge collector 131 receives ions that pass through the area defined by the first aperture 121, while the second charge collector 132 receives ions that pass through the area defined by the second aperture 122. In some embodiments, the beam height is less than the height of the apertures 121, 122. In this case, the charge collected by the first charge collector 131 is proportional to the beam height multiplied by the width of the first aperture 121. The charge collected by the second charge collector 132 is proportional to the beam height multiplied by the width of the second aperture 122.

In this way, the ratio of the number of ions received by the first charge collector 131 to the number of ions received by the second charge collector 132 may be equal to the ratio of the widths of the respective apertures 121, 122, or w1/w2.

A control system 140 is in communication with the charge collectors 131, 132. By monitoring the number of ions collected by the charge collectors 131, 132, the control system 140 can determine the ion beam current. This current is an aspect of ion implantation, as it helps determine dose, dopant uniformity, implantation time, and other parameters. In addition, an actuator 150 is in communication with the control system 140 and the defining aperture plate 120. This actuator 150 serves to move the defining aperture plate 120 into and out of the path of the ion beam 110, as described above. In some embodiments, the actuator 150 provides only horizontal (i.e. x direction) motion, while in other embodiments, vertical motion (i.e. y direction) is also allowed.

Figure 2:
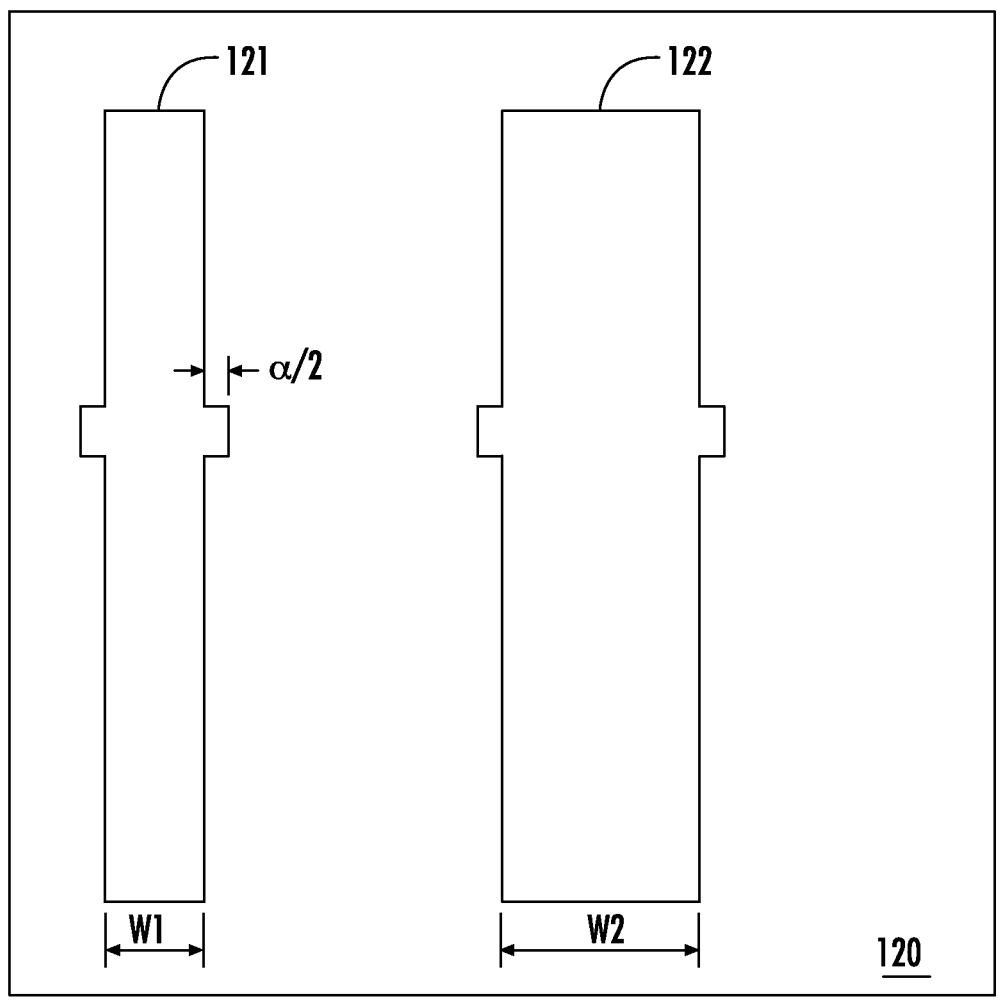
FIG. 2 shows the plate of FIG. 1 after some amount of erosion.

FIG. 2 shows the defining aperture plate 120 of FIG. 1 after continued exposure to the ion beam 110. As stated above, the defining aperture plate may alternatively comprise two physical plates, each with a respective aperture. Since the ion beam 110 is narrower than the height of the apertures 121, 122, erosion of the apertures is confined to a small region. While FIG. 2 shows the ion beam striking the apertures 121, 122 near their centers, the ion beam 110 may strike any part of the apertures 121, 122 and the disclosure is not limited by this embodiment. Since the ion beam strikes the region around each aperture 121, 122 equally, the erosion is nearly identical about each aperture 121, 122. In other words, the width of each aperture 121, 122, where it is exposed to the ion beam 110, grows by the same amount. For purposes of illustration, it is assumed that the erosion is symmetric and is defined as $\alpha/2$ on each side of each aperture 121, 122. Because of this erosion, the first charge collector 131 now receives more ions. For example, since the width of the first aperture 121 is now w1+$\alpha$, the ratio of ions that first charge collector 131 will now receive as compared to those received in FIG. 1 can be defined as (w1+$\alpha$)/w1. Similarly, the second aperture 122 now has a width of w2+$\alpha$, so the second charge collector 132 will also receive more ions. As compared to the ions received in FIG. 1, the second charge collector 132 will now receive (w2+$\alpha$)/w2 times as many ions. If the erosion is not accounted for, the control system 140 will believe that the ion beam has a greater current than it actually does, as the control system 140 still assumes that the aperture widths are w1 and w2, respectively.

For illustrative purposes, assume that w1 is ⅛ (0.125) inches and w2 is ¼ (0.250) inches. Also assume that erosion causes a constant increase in width of 0.05 inches. In this example, the first charge collector 131 will receive (0.125+0.05)/0.125, or 1.4 times as many ions as it did before the erosion. Similarly, the second charge collector 132 will receive (0.250+0.05)/0.250, or 1.2 times as many ions as it did before the erosion.

In addition, the ratio of ions received by the first charge collector 131 to those received by the second charge collector 132 also changes. As described earlier, this ratio is equal to the ratio of the widths of the corresponding apertures 121, 122. Thus, in FIG. 1, the ratio of ions received by the first charge collector 131 to those received by the second charge collector 132 is given by w1/w2. In FIG. 2, that ratio changes to $(w1+\alpha)/(w2+\alpha)$. If w1 is less than w2, this ratio gradually increases with continued erosion. Conversely, if w1 is greater than w2, this ratio gradually decreases with continued erosion.

The use of two differently dimensioned apertures 121, 122 provides the ability to monitor the erosion of the apertures and respond appropriately.

Figure 3:
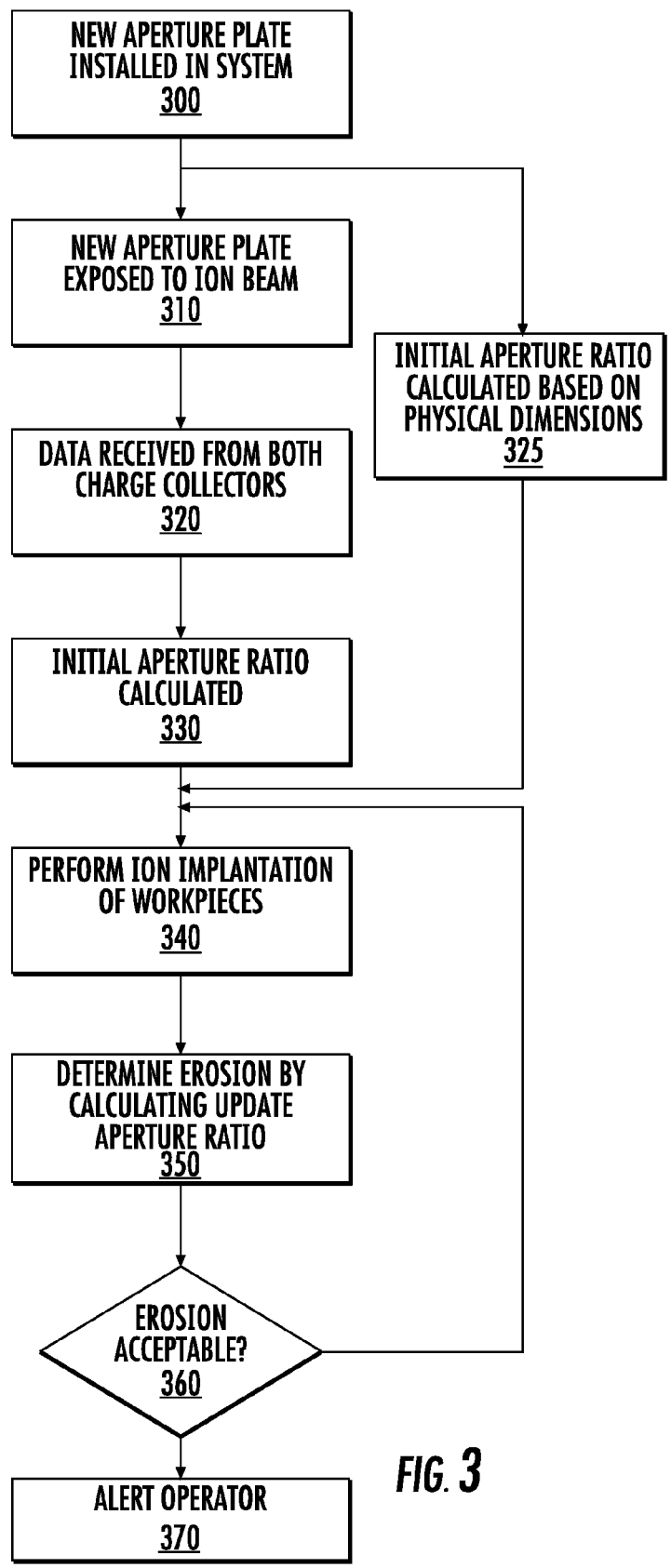
FIG. 3 shows a flowchart according to a first embodiment.

FIG. 3 shows a flowchart according to a first embodiment. The sequence illustrated in this flowchart may be executed by the control system 140. This control system 140 may comprise a processing unit, such as a microprocessor, and an associated memory device, which is used to stored instructions to be executed by the processing unit. This memory device may be non-volatile, volatile, or both, and may also be used to store data as well. The control system 140 may also have various inputs and outputs. For example, the control system 140 may receive input from the charge collectors 131, 132. Similarly, it may have outputs that allow the defining aperture plate 120 to be moved. Additional inputs and outputs may also be part of the control system 140.

In this embodiment, a new defining aperture plate 120 is installed in the ion implantation system as shown in Box 300. Next, the defining aperture plate 120 is moved into the path of the ion beam 110, as shown in Box 310. In some embodiments, the defining aperture plate 120 is moved horizontally across the ion beam 110. In other embodiments, the defining aperture plate 120 is moved to a fixed position in the path of the ion beam without traversing the entire ion beam 110. Other embodiments are also possible. However, the goal to insure that both apertures 121, 122 of the defining aperture plate 120 are in the path of the ion beam 110. The control system 140 controls the actuator 150 to move the defining aperture plate 120 into the desired position.

The control system 140 then receives data from the first charge collector 131 and the second charge collector 132 regarding the number of ions that each received, as shown in Box 320. The control system 140 then saves the ratio of these values as the initial aperture ratio, as shown in Box 330. This initial aperture ratio, as explained above, should represent the ratio of the width of the first aperture 121 to the width of the second aperture 122, before any erosion has occurred.

In a second embodiment, no initial ion measurement is made. Rather, the ratio of the width of the first aperture 121 to the width of the second aperture 122 is defined as the initial aperture ratio. In this embodiment, Boxes 310,320,330 of FIG. 3 are not performed, and Box 325 simply consists of a calculation of the ratio of the physical aperture widths.

Once this initialization process is completed, the ion implantation system may operate as normal, as shown in Box 340. In this mode, the defining aperture plate 120 may be used periodically to measure the ion beam current as explained above. In normal operation, the control system 140 may measure ion beam current using data from one or both of the charge collectors 131, 132. In one embodiment, data from the charge collector associated with the larger aperture may be used, as this aperture is less sensitive to erosion. In another embodiment, data from the charge collector associated with the smaller aperture may be used.

At various intervals, the control system may make a determination of erosion, as shown in Box 350. This may be done while the ion beam current is being measured (see Box 340), or may be a separate procedure. The defining aperture plate 120 is disposed in the path of the ion beam so that both apertures 121, 122 are equally exposed to the ion beam 110. The ratio of the ions received by the first charge collector 131 to the ions received by the second charge collector 132 is determined. The charge collectors 131, 132 may be exposed to the ion beam 110 for a predetermined duration to allow the charge to be integrated over time. In other embodiments, an instantaneous measurement may be made. In either embodiment, this ratio is referred to as the updated aperture ratio.

The control system 140, in Decision Box 360, then compares the updated aperture ratio to the initial aperture ratio, found in Box 330 or Box 325. If these ratios are within a predetermined tolerance of one another, the control system 140 determines that the amount of erosion is acceptable and allows normal operation to continue by returning to Box 340. If the control system 140 determines that the deviation between the updated aperture ratio and the initial aperture ratio is too great, the operator is notified, as shown in Box 370.

Figure 4:
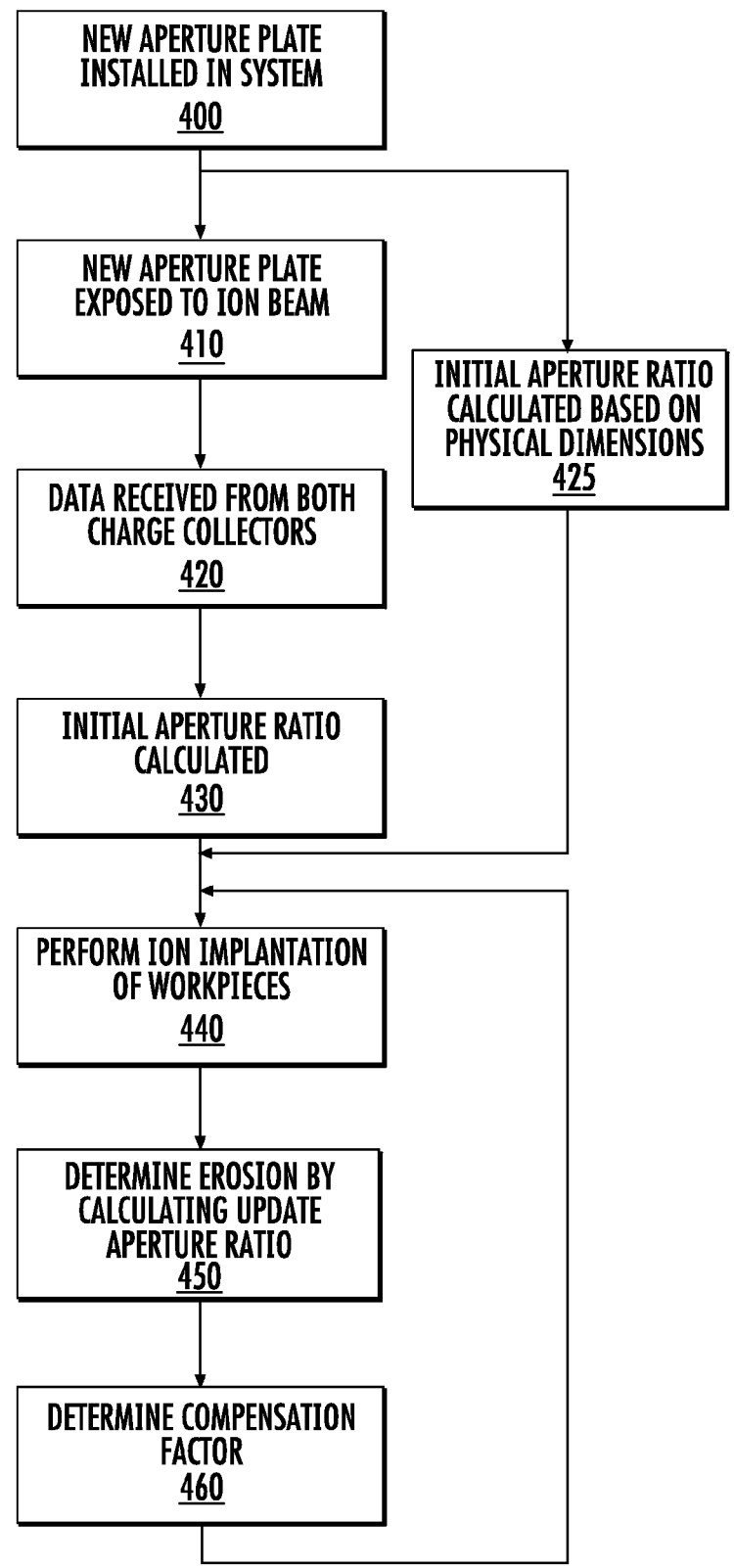
FIG. 4 shows a flowchart according to a second embodiment.

FIG. 4 represents a second embodiment, in which the control system 140 determines and compensates for erosion of the apertures 121, 122. The initialization process of Boxes 400-440 are similar to those described in FIG. 3 and are not repeated. Alternatively, as described above, Boxes 410, 420, 430 can be eliminated and the initial aperture ratio may be calculated based on the relative widths of the apertures, as shown in Box 425.

In Box 450, the control system 140 makes a determination of erosion. This may be done in the same way as described above with respect to FIG. 3. However, in this embodiment, the control system 140 determines a compensation factor, as shown in Box 460. In some embodiments, the measurements may be differentiated with respect to time and/or position. In other embodiments, the actual measurements are used directly to determine erosion. In some of these embodiments, the measurements obtained from the two charge collectors may be integrated over time to average the charges collected, as described above. For example, based on the initial aperture ratio and the updated aperture ratio, it may be possible to determine the amount of erosion. Assume w1 is the initial width of the first aperture 121, w2 is the initial width of the second aperture 122, k is the initial aperture ratio (w1/w2), $\alpha$ is the increase in the width of each aperture 121, 122, and k1 is the updated aperture ratio $((w1+\alpha)/(w2+\alpha))$. It may be shown that the erosion $\alpha$, as a function of w2, is equal to $w2(k1-k)/(1-k1)$. It may further be shown that the ratio of the updated width of the second aperture 122 (i.e. $w2+\alpha$) to its initial width (w2) is $(1-k)/(1-k1)$. Similarly, the ratio of the updated width $(w1+\alpha)$ of the first aperture 121 to its initial width (w1) may be defined as $k1(1-k)/(k(1-k1))$. Of course, these calculations assume that $\alpha$ is constant for both apertures 121, 122. Other values may result if different assumptions are made.

Once the ratio of the updated width of each aperture to its initial width is determined, it is then possible to compensate for the change in aperture width by multiplying the data received from the charge collectors 131, 132 by a compensation factor. This compensation factor serves to adjust the data received from the charge collectors 131, 132 to eliminate the effects of erosion. In this way, the ion implantation system 100 may continue operating normally (Box 440), even when the defining aperture plate 120 has begun eroding. In other words, even though the defining aperture plate 120 no longer has the initial aperture ratio, the system may continue to deliver the desired dose. The use of the compensation factor allows the control system 140 to calculate the actual ion beam current, even in the presence of erosion of the apertures 121, 122. This calculated actual current is then used to control the ion beam parameters. This compensation technique increases the time between required preventative maintenance and also serves to provide a much more accurate representation of the ion beam current over time.

For example, assume the control system 140 determines that the width of the first aperture 121 has increased by 10% due to erosion, as calculated in Box 450. Because of this, the first charge collector 131 will theoretically receive 10% more ions than it did when the defining aperture plate 120 was first installed, for the same ion beam current. Therefore, to compensate for this erosion, the resulting charge value from the first charge collector 131 may be divided by 1.10. This may normalize the output of the first charge collector 131 and allow continued operation even after erosion has changed the actual aperture width.

The use of two apertures on a defining aperture plate 120 may also have other applications. For example, assume that the defining aperture plate 120 travels through the ion beam 110 in the horizontal direction. Under normal operating conditions, if the ion beam is relatively uniform, it may be expected that the charge collected by a particular charge collector 131, 132 is relatively constant as a function or time and beam location. Furthermore, it may also be expected that the ratio of the charge collected by each of these charge collectors 131, 132 remains relatively constant. Therefore, deviations from this expected behavior may be indicative of beam non-uniformity or other issues.

Figure 5A:
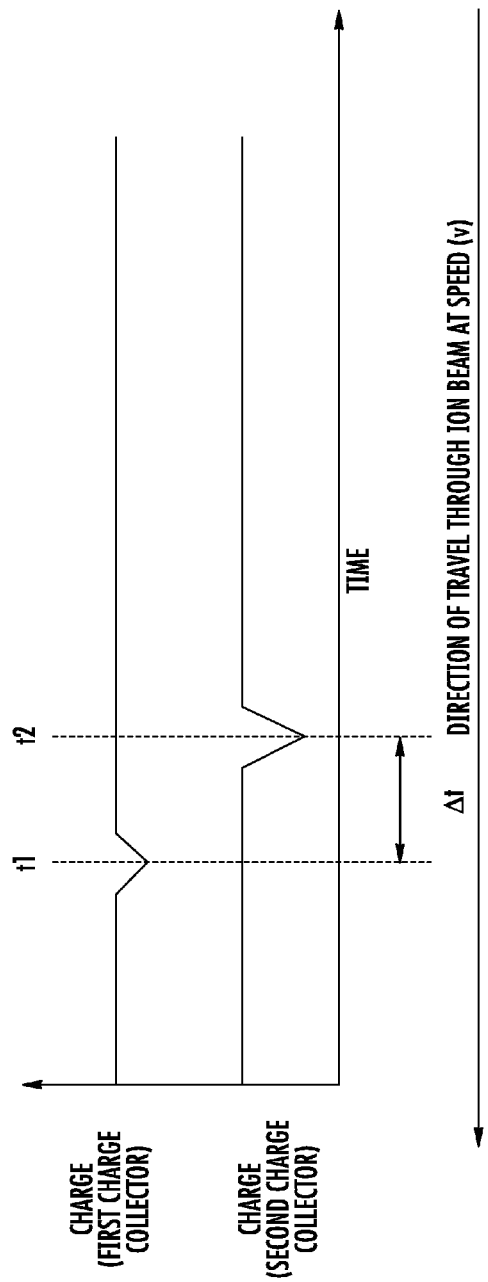
FIG. 5A shows a timing diagram showing charge collection of the two charge collectors during a first error condition.
Figure 5B:
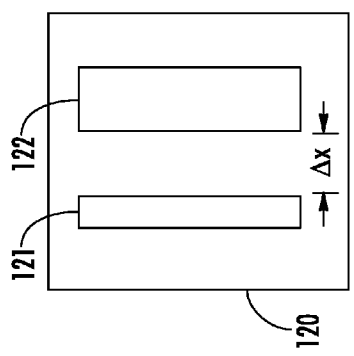
FIG. 5B shows a defining aperture plate used in the embodiment of FIG. 5A.

FIG. 5A shows a timing diagram showing the charge collected by the first charge collector 131 and the second charge collector 132 as a function of time during a first error condition. In this embodiment, the defining aperture plate 120, such as the one shown in FIG. 5B, travels at a constant speed, v, through the ion beam 110. Note that, as described above, instead of one defining aperture plate, two separate physical plates having a fixed spatial relationship to one another may also be employed. Note that during most points in time, the charge collected by the second charge collector 132 is twice that of the first charge collector 131. This is due to the difference in their respective aperture widths. However, in this figure, the first charge collector 131 receives a lower amount of charge than expected at time t1. Similarly, the second charge collector 132 received a lower amount of charge than expected at time t2. This difference in time ($\Delta t=t2-t1$) multiplied by the speed, v, of the defining aperture plate 120, determines the distance, $\Delta x$, between these two events. If this distance, $\Delta x$, is the same as the distance between the first aperture 121 and the second aperture 122 on the defining aperture plate 120, this signifies that the anomaly occurs at the same spatial location within the ion beam 110. This may be indicative of a deficiency at this location in the ion beam 110, which should be addressed. While FIG. 5A shows a decrease in charge collected during the anomaly, the disclosure is not limited to this embodiment. In other embodiments, the anomaly in the ion beam 110 may constitute a spatial position where the beam current is too great.

Figure 6:
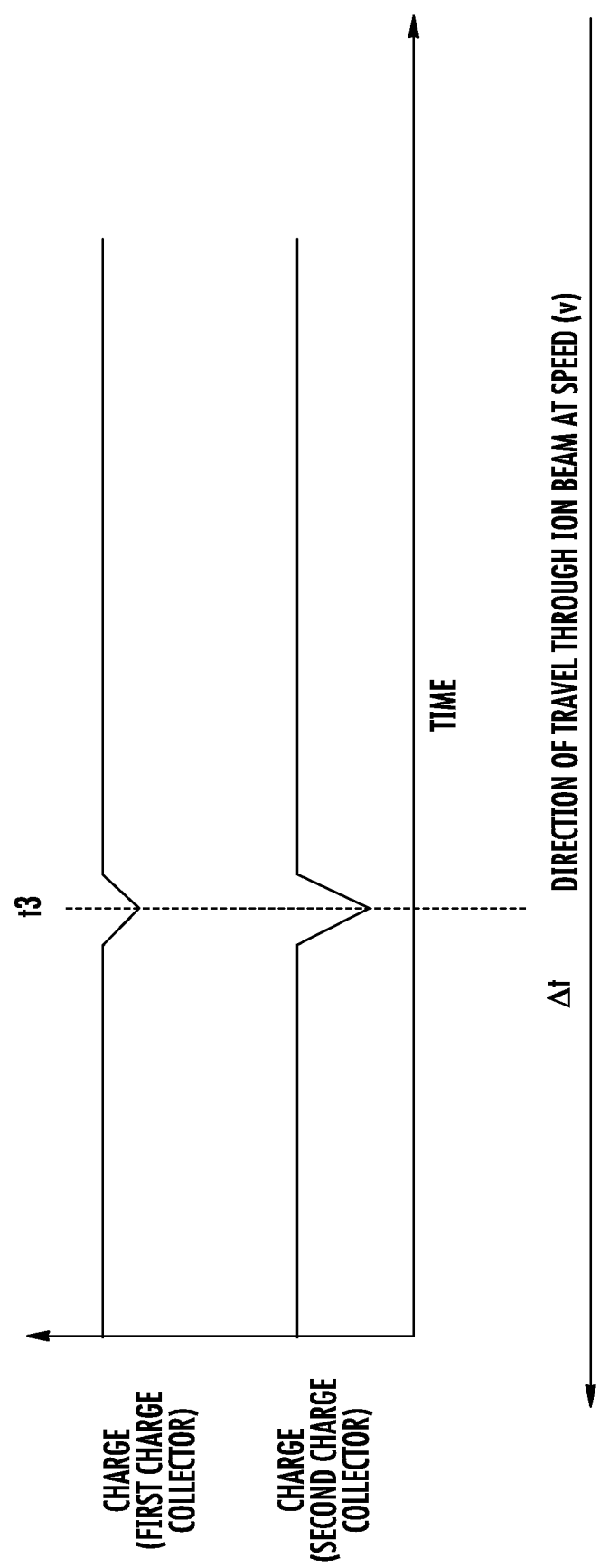
FIG. 6 shows a timing diagram showing charge collection of the two charge collectors during a second error condition.

FIG. 6 shows a second timing diagram showing a second possible error condition. In this embodiment, like that of FIG. 5A, the charge collected by the second charge collector 132 is typically twice than collected by the first charge collector 131, due to the difference is respective aperture width. However, in this embodiment, at time t3, both charge collectors experience an anomaly. While FIG. 6 shows a decrease in current, the anomaly may also be an increase in current. Since the anomaly occurred for both charge collectors 131, 132 simultaneously, this is not a spatial anomaly, as described in conjunction with FIG. 5A. Rather, this illustrates a temporal disturbance where the entire beam is affected at a point in time.

Thus, the use of two apertures 121, 122 and two charge collectors 131, 132 allows the control system 140 to distinguish between spatial ion beam anomalies and temporal anomalies. The performance of an ion beam tuning system is also measured based on two metrics; dopant or beam uniformity and time, where the time metric is defined as the time it takes to achieve an acceptable uniformity. By being able to differentiate between spatial and temporal anomalies, a more appropriate corrective action may be determined, thereby reducing the time required for the ion beam to achieve the desired uniformity.

In another embodiment, the horizontal speed, v, of the defining aperture plate 120 may be modified. Specifically, the horizontal speed, v, and distance, $\Delta x$, define a frequency. This may allow the control system 140 to identify frequency anomalies in the ion beam.

The use of two different sized apertures allows the control system 140 to monitor the current as measured by the two charge collectors. Based on changes in the updated aperture ratio, the control system 140 may determine the erosion of the apertures 121, 122. Based on the erosion of the apertures, the control system 140 may modify or regulate the implant process. For example, in one embodiment, shown in FIG. 3, the control system 140 ceases the implant process and alerts the operator if the deviation between the updated aperture ratio and the initial aperture ratio is too great. In other words, if the erosion of the apertures is too great, the implant process is stopped. This prevents an erroneous ion beam current measurement from affecting the workpieces. In another embodiment, the control system 140 continues the implant process if the deviation between the updated aperture ratio and the initial aperture ratio is within a predetermined threshold. In yet another embodiment, the control system 140 uses the deviation between the updated aperture ratio and the initial aperture ratio (i.e. the erosion) to determine a compensation factor, as shown in FIG. 4. This compensation factor is then used to calculate the actual ion beam current. This compensation factor allows the control system 140 to continue the implant process, using the calculated ion beam currents to determine dosage and properly regulate and modify the implant process.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:
    an ion source generating an ion beam;
    a defining aperture plate having two differently sized apertures;
    two charge collectors, each disposed behind a respective one of said two differently sized apertures;
    an actuator to drive the defining aperture plate through a portion of said ion beam; and
    a control system in communication with said two charge collectors to monitor an ion beam current of said ion beam, wherein said control system:
    calculates an initial aperture ratio, based on a ratio of widths of said two differently sized apertures;
    calculates an updated aperture ratio based on a ratio of charge measured by each of said two charge collectors; and
    uses said initial aperture ratio and said updated aperture ratio to control said implantation system.

2. The ion implantation system of claim 1, wherein said control system sets parameters for said ion implantation system based on said ion beam current.

3. The ion implantation system of claim 2, wherein said control system:
    determines a compensation factor based on said updated aperture ratio and said initial aperture ratio; and
    calculates said ion beam current based on charge collected by said two charge collectors and said compensation factor.

4. The ion implantation system of claim 1, wherein said control system:
    determines an amount of erosion of said differently sized apertures based on said initial aperture ratio and said updated aperture ratio.

5. The ion implantation system of claim 4, wherein said implantation system implants said workpiece if said amount of erosion is less than a predetermined threshold.

6. The ion implantation system of claim 4, wherein said control system stops implanting said workpiece if said amount of erosion is greater than a predetermined threshold.

7. The ion implantation system of claim 1, wherein said control system determines an anomaly in said ion beam based on charge measured by said two charge collectors.

8. The ion implantation system of claim 7, wherein said anomaly comprises a spatial anomaly in said ion beam.

9. The ion implantation system of claim 7, wherein said anomaly comprises a temporal anomaly in said ion beam.

10. A method of processing workpieces using an ion beam, comprising:
    implanting workpieces using said ion beam, where parameters of an ion implant are based on an ion beam current of said ion beam;
    passing a plate in front of a portion of said ion beam, said plate having two differently sized apertures through which ions may pass;
    determining an initial aperture ratio, based on a ratio of initial widths of said two differently sized apertures;
    collecting charge received by a first charge collector and a second charge collector, each behind a respective aperture, said charge collected by said first charge collector and said second charge collector representative of ion beam current passing through said respective apertures; and
    determining an updated aperture ratio based on a ratio of charge collected by said first charge collector to charge collected by said second charge collector.

11. The method of claim 10, further comprising continuing said implanting if said updated aperture ratio does not deviate from said initial aperture ratio by more than a predetermined amount.

12. The method of claim 10, further comprising ceasing said implanting if said updated aperture ratio deviates from said initial aperture ratio by more than a predetermined amount.

13. The method of claim 10, further comprising:
    determining a compensation factor based on a deviation between said initial aperture ratio and said updated aperture ratio;
    using said compensation factor to correct for erosion of said apertures in order to calculate ion beam current; and
    adjusting said parameters used during said implanting based on said calculated ion beam current.

14. The method of claim 10, further comprising identifying spatial and temporal anomalies in said ion beam and adjusting said parameters based on said identified anomalies.

15. A method of processing workpieces using an ion beam, comprising:
    implanting workpieces using said ion beam;
    passing a plate in front of a portion of said ion beam, said plate having two differently sized apertures through which ions may pass;
    determining an initial aperture ratio, defined as a ratio of a width of a first of said two differently sized apertures to a width of a second of said differently sized apertures;
    collecting charge received by a first charge collector and a second charge collector, each disposed behind a respective aperture;
    calculating an updated aperture ratio based on a ratio of charge collected by said first charge collector to charge collected by said second charge collector;
    determining erosion of said two differently sized apertures based on a comparison of said updated aperture ratio to said initial aperture ratio; and
    modifying said ion implanting based on said determined erosion.

16. The method of claim 15, wherein said modifying said ion implanting comprises ceasing said ion implanting if said determined erosion is greater than a predetermined threshold.

17. The method of claim 15, wherein said modifying said ion implanting comprises:
    calculating an ion beam current based on said determined erosion, said charge collected by said first charge collector and said charge collected by said second charge collector; and
    adjusting the parameters used during the implanting based on said calculated ion beam current.

* * * * *